(12) United States Patent
Zou

(10) Patent No.: US 10,756,069 B2
(45) Date of Patent: Aug. 25, 2020

(54) DISPLAY DEVICE MANUFACTURING METHOD, DISPLAY DEVICE AND ELECTRONICS APPARATUS

(71) Applicant: Goertek, Inc., Weifang, Shandong (CN)

(72) Inventor: Quanbo Zou, Weifang (CN)

(73) Assignee: Goertek Inc., Weifang, Shandong (CN)

( * ) Notice: Subject to any disclaimer, the term of this patent is extended or adjusted under 35 U.S.C. 154(b) by 0 days.

(21) Appl. No.: 16/465,770

(22) PCT Filed: Dec. 12, 2016

(86) PCT No.: PCT/CN2016/109466
§ 371 (c)(1),
(2) Date: May 31, 2019

(87) PCT Pub. No.: WO2018/107323
PCT Pub. Date: Jun. 21, 2018

(65) Prior Publication Data
US 2020/0083197 A1  Mar. 12, 2020

(51) Int. Cl.
*H01L 33/06* (2010.01)
*H01L 25/075* (2006.01)
*H01L 21/66* (2006.01)
*H01L 33/38* (2010.01)
*H01L 33/00* (2010.01)
*H01L 33/40* (2010.01)

(52) U.S. Cl.
CPC ......... *H01L 25/0753* (2013.01); *H01L 22/22* (2013.01); *H01L 33/0093* (2020.05); *H01L 33/385* (2013.01); *H01L 33/06* (2013.01); *H01L 33/40* (2013.01); *H01L 2933/0016* (2013.01)

(58) Field of Classification Search
None
See application file for complete search history.

(56) References Cited

U.S. PATENT DOCUMENTS

| 10,163,869 B2 | 12/2018 | Zou et al. | |
| 2011/0151602 A1* | 6/2011 | Speier | H01L 33/0079 438/26 |
| 2013/0126081 A1* | 5/2013 | Hu | H01L 24/75 156/249 |
| 2014/0027709 A1* | 1/2014 | Higginson | H01L 25/167 257/13 |

FOREIGN PATENT DOCUMENTS

| CN | 101222011 A | 7/2008 |
| CN | 102738342 A | 10/2012 |
| CN | 106170849 A | 11/2016 |

* cited by examiner

*Primary Examiner* — Bradley Smith
(74) *Attorney, Agent, or Firm* — Baker Botts, L.L.P.

(57) ABSTRACT

A display device manufacturing method, display device and electronics apparatus are provided. The display device manufacturing method comprises: forming the vertical micro-LEDs on a growth substrate: forming a first electrode on top of each of the vertical micro-LEDs; forming a second electrode on side surface of each of the vertical micro-LEDs; and transferring the vertical micro-LEDs from the growth substrate to a display substrate of a display device. An embodiment of this invention can reduce the back-end fabrication process on a display substrate after transfer.

9 Claims, 3 Drawing Sheets

_US 10,756,069 B2_

DISPLAY DEVICE MANUFACTURING METHOD, DISPLAY DEVICE AND ELECTRONICS APPARATUS

CROSS-REFERENCE TO RELATED APPLICATIONS

This application is a National Stage of International Application No. PCT/CN2016/109466 filed on Dec. 12, 2016, which is hereby incorporated by reference in its entirety.

FIELD OF THE INVENTION

The present invention relates to the technical field of micro-LED, and more specifically, to a method for manufacturing a display device with vertical micro-LEDs, a display device and an electronics apparatus.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market.

In the prior art, a micro-LED arranged on a display device such as a display panel can have a vertical structure to achieve a high definition. In such a micro-LED, a top electrode is arranged on top of the micro-LED and contacts the top surface of the micro-LED to form a common electrode. The micro-LED emits light from the top surface. The top electrode is transparent.

For example, U.S. Pat. No. 9,367,094 B2 discloses a display module and system application, which is hereby incorporated herein by reference.

Generally, the top electrode on a display substrate is a cathode or N electrode (N metal) and is in an Ohmic contact with the n-EPI surface of the micro-LED. The n-EPI region shall be etched deeply to reach the heavy doping region of n-EPI (e.g., N++ GaN region). This deep etching will add processing complexity. As a result, a cost/yield/reliability issues will rise. The bottom electrode is a anode or P electrode (P metal).

FIG. 1 shows a schematic diagram of vertical micro-LEDs on a growth substrate of the prior art. As shown in FIG. 1, the vertical micro-LEDs 100 are formed on the growth substrate 101. For example, the vertical micro-LEDs 100 are formed through epitaxy growth. The vertical micro-LED 100 may include a P doped region 106, a multiple quantum well (MQW) region 105 and an N doped region 104. The N doped region 104 may include an N++ heavily doped region 103. Optionally, vertical micro-LED 100 may further include an un-doped epitaxy region 102 grown on the growth substrate 101. A P electrode or anode 107 may be formed on the top of the vertical micro-LED 100.

In addition, the conductive top electrode will degrade optical efficiency, to an extend of around 5~20%, for example, due to its imperfect optical transmittance.

In addition, in such a micro-LED, a side light leakage may decrease the optical efficiency thereof. This may become even more serious when a micro-LED has a small size, for example, equal to or less than 10 μm, for a high-resolution display.

In addition, in such a micro-LED, heat dissipation is limited to the bottom and top surfaces thereof. This is insufficient in a small micro-LED for a high resolution. This may cause an overheating issue. Accordingly, the efficiency and/or lifetime of the micro-LED may degrade.

In addition, in the prior art, the cathode or N electrode are formed after the micro-LEDs are transferred to the display substrate, and thus the processing of the N electrode may be limited.

Therefore, there is a demand in the art that a new solution for a micro-LED of vertical structure shall be proposed to address at least one of the problems in the prior art.

SUMMARY OF THE INVENTION

One object of this invention is to provide a new technical solution for a micro-LED with vertical structure.

According to a first aspect of the present invention, there is provided a method for manufacturing a display device with vertical micro-LEDs, comprising: forming the vertical micro-LEDs on a growth substrate; forming a first electrode on top of each of the vertical micro-LEDs; forming a second electrode on side surface of each of the vertical micro-LEDs; and transferring the vertical micro-LEDs from the growth substrate to a display substrate of a display device.

Alternatively or optionally, the first electrode is a P electrode and the second electrode is an N electrode.

Alternatively or optionally, each of the vertical micro-LEDs includes a second type doped region provided above the growth substrate, a multiple quantum well region provided above the second type doped region and a first type doped region provided above the multiple quantum well region, and the second electrode is formed on side surface of the second type doped region.

Alternatively or optionally, the first type doped region is a P doped region, the second type doped region is an N doped region and includes an N heavily doped region, and the second electrode is formed on side surface of the N doped region and is Ohmic contact with the N heavily doped region.

Alternatively or optionally, the forming a second electrode includes: depositing the second electrode on the top and side surface of each of the vertical micro-LEDs; coating photoresist on the second electrode; etching back the photoresist to expose the multiple quantum well region and the first type doped region and cover the second electrode on the side surface of the vertical micro-LED; etching the exposed second electrode; and removing the remaining photoresist.

Alternatively or optionally, the method further comprises: testing the vertical micro-LEDs on the growth substrate through the first electrode and second electrode to determine known good dies of the vertical micro-LEDs on the growth substrate, wherein the transferring the vertical micro-LEDs includes: transferring known good dies of the vertical micro-LEDs from the growth substrate to the display substrate.

Alternatively or optionally, the out layer of the first electrode is Au.

Alternatively or optionally, the second electrode is a stack of metal layers including Cr, Al, ITO, Ni, Au, Ag, Ti and TiN.

According to a second aspect of the present invention, there is provided a display device, which is manufactured by using the method for manufacturing a display device with vertical micro-LEDs according to any of the embodiments of the present invention.

According to a third aspect of the present invention, there is provided an electronics apparatus, comprising a display device according to any of the embodiments of the present invention.

An embodiment of this invention can reduce the back-end fabrication process on a display substrate after transfer.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
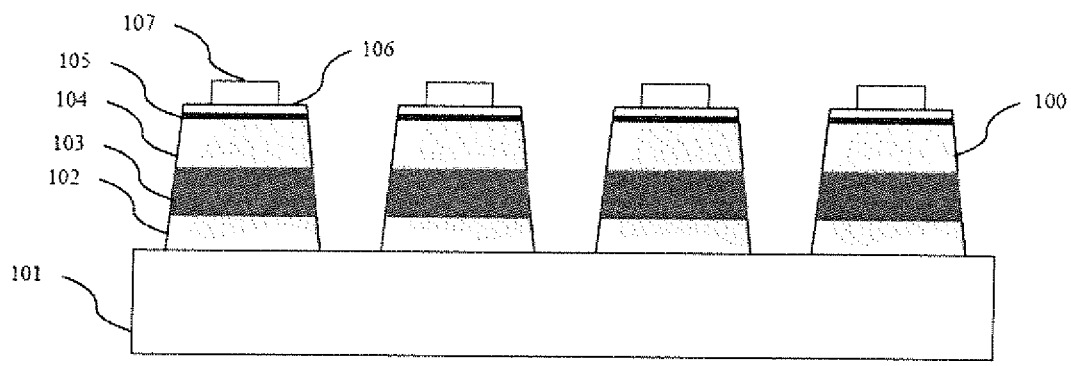
FIG. 1 is a schematic diagram of vertical micro-LEDs on a growth substrate of the prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the embodiments of the present invention, it is proposed to form side-contact electrodes of the vertical micro-LEDs on a growth substrate, to reduce the back-end fabrication process on a display substrate after transfer. This allows for a higher temperature process on wafer and thus produces a better micro-LED performance. Furthermore, this will significantly reduce the processing on a display panel after transfer.

Embodiments and examples will be described with reference to the drawings in details.

Figure 2:
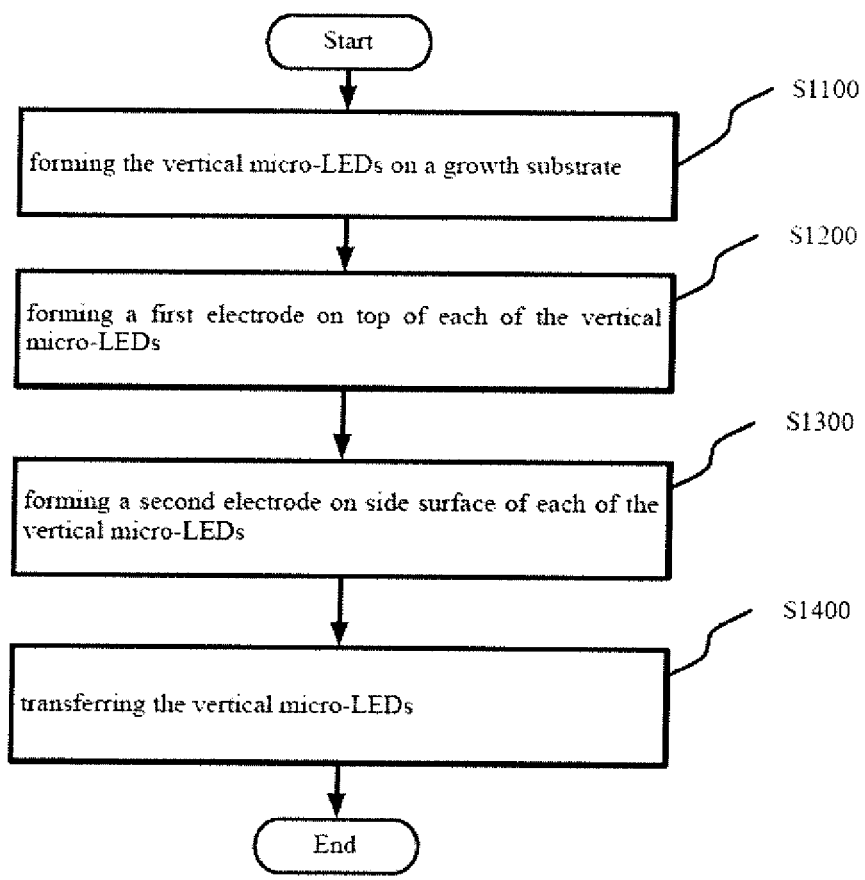
FIG. 2 schematically shows a method for manufacturing a display device with vertical micro-LEDs according to an embodiment of the present invention.

FIG. 2 schematically shows a method for manufacturing a display device with vertical micro-LEDs according to an embodiment of the present invention.

As shown in FIG. 2, at step S1100, the vertical micro-LEDs are formed on a growth substrate. The vertical micro-LEDs may be those as shown in FIG. 1.

At step S1200, a first electrode is formed on top of each of the vertical micro-LEDs.

At step S1300, a second electrode is formed on side surface of each of the vertical micro-LEDs.

For example, the first electrode is a P electrode and the second electrode is an N electrode.

In an example, each of the vertical micro-LEDs includes a second type doped region provided above the growth substrate, a multiple quantum well region provided above the second type doped region and a first type doped region provided above the multiple quantum well region. The second electrode is formed on side surface of the second type doped region.

For example, the first type doped region is a P doped region, the second type doped region is an N doped region and includes an N heavily doped region, and the second electrode is formed on side surface of the N doped region and is Ohmic contact with the N heavily doped region.

Although it is shown in FIG. 2 that the step S1300 is after the step S1200, it will be appreciated by a person skilled in the art that the step S1200 may take place after the step S1300 or at the same time of the step S1300.

For example, the first type electrode may be formed on the top of the vertical micro-LED after the forming of the second type electrode.

Alternatively, the first and second electrodes may be formed at the same time. For example, electrode material may be formed or deposited on the top and side surfaces of the micro-LED. Photoresist is then formed on the surfaces of the first and second electrodes to expose the portion of the electrode material between them by patterning or in another way. The exposed portion of the electrode material is then removed.

In an example, this step may further includes: depositing the second electrode on the top and side surface of each of the vertical micro-LEDs; coating photoresist on the second electrode; etching back the photoresist to expose the multiple quantum well region and the first type doped region and cover the second electrode on the side surface of the vertical micro-LED; etching the exposed second electrode; and removing the remaining photoresist.

In an example, the out layer of the first electrode is Au. In this situation, the first electrode may be formed prior to the forming of the second electrode. When the exposed second electrode is being removed, the out layer of Au will protect the first electrode from being removed.

For example, the second electrode is a stack of metal layers including Cr, Al, ITO, Ni, Au, Ag, Ti and TiN.

In the embodiment of the present invention, since the first and second electrodes are formed the growth substrate, the micro-LEDs can be tested before they are transferred to a display substrate. For example, the vertical micro-LEDs on the growth substrate are tested through the first electrode and second electrode to determine known good dies (KGD) of the vertical micro-LEDs on the growth substrate. As such, only KGD micro-LEDs will be transferred to the display substrate.

At step S1400, the vertical micro-LEDs are transferred from the growth substrate to a display substrate of a display device.

For example, the micro-LEDs are tested before the transfer, and known good dies of the vertical micro-LEDs are transferred from the growth substrate to the display substrate.

Generally, the thickness of the second electrode is just 0.1~0.2 μm. When the micro-LEDs are lifted off from the growth substrate, the connection strength of the second electrode at the surface of the growth substrate can be ignored.

Alternatively or optionally, the micro-LEDs can be transferred by laser lifting-off. The growth substrate is laser transparent. When the laser is irradiated onto the micro-LEDs to be transferred through the growth substrate, the second electrode on the surface of the growth substrate will be broken, which will easy the transfer. For example, the material of the second electrode is Al, whose melting point is about 670° C. It will broken when the laser is irradiated onto it from the growth substrate.

After the transfer, the second electrode any be connected and a protection layer may be placed on the top of the vertical micro-LEDs to finish a display device. This processing can be performed by using an approach of the prior art, and thus it is not described in detail here.

In the embodiments of the present invention, the second electrode is formed before the micro-LED is transferred to a display substrate. The impact of forming an electrode onto the display panel will be reduced.

Optionally, compared with the forming of an electrode onto a display substrate, it is much easier to form it on a growth substrate (wafer). For example, the quality and/or evenness of the vertical micro-LEDs will be improved.

Optionally, an embodiment of the present invention will allow for a test on a wafer and transfer of KGD micro-LEDs.

Optionally, an embodiment of the present invention will reduce the back-end fabrication process on a display substrate after transfer.

FIGS. 3-7 schematically shows a process of manufacturing a display device according to an embodiment of this invention.

Figure 3:
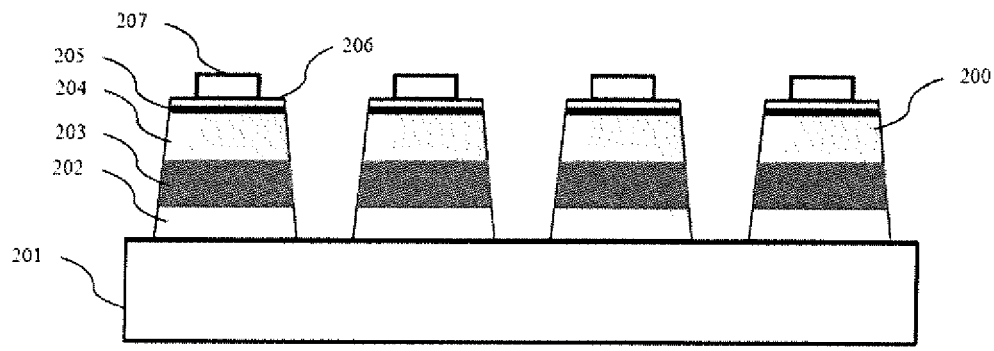
FIGS. 3-7 schematically shows a process of manufacturing a display device according to an embodiment of this invention.

As shown in FIG. 3, vertical micro-LEDs 200 are formed on a growth substrate 201, for example, by epitaxy growth. For example, the vertical micro-LEDs 200 are separated by epitaxy trenches through patterning and etching. The micro-LEDs 200 may include a P doped region (a first type doped region) 206, a MQW region 205 and an N doped region (first type doped region) 204. The N doped region may further include an N++ heavily doped region 203. An un-doped epitaxy layer 202 may be formed between the micro-LED 200 and the growth substrate 201. A P electrode 207 may be formed on the top of the micro-LEDs 200.

Figure 4:
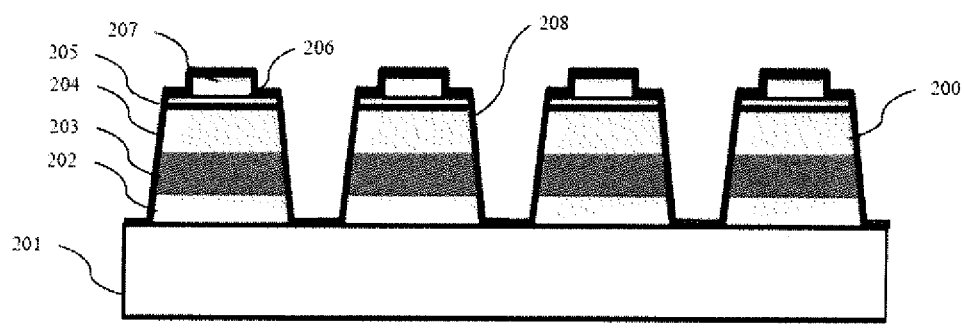

As shown in FIG. 4, the material of a second electrode 208 is formed on the surfaces of the micro-LEDs 200 and the growth substrate 201, which include the side surface of the micro-LED 200.

Figure 5:
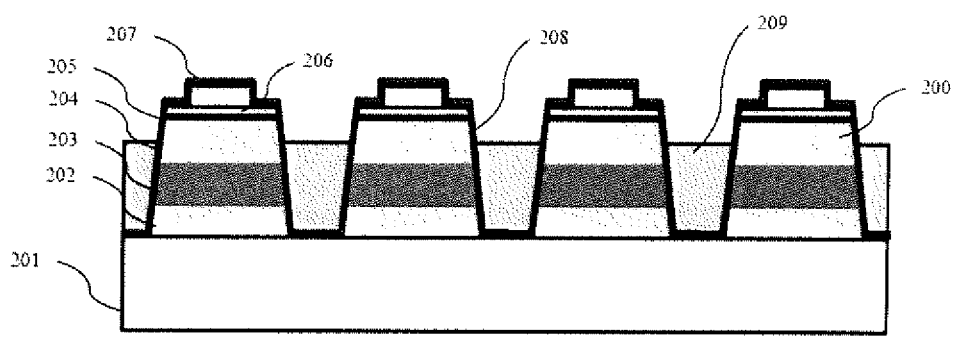

As shown in FIG. 5, photoresist 209 are coated on the second electrode 208. The photoresist 209 is etched back to be below the MQW region 205, to expose the MQW region 205 and the first type doped region 206 and cover the second electrode on the side surface of the vertical micro-LED. For example, the photoresist 209 covers the second electrode at side surface of the heavily doped region 203.

Figure 6:
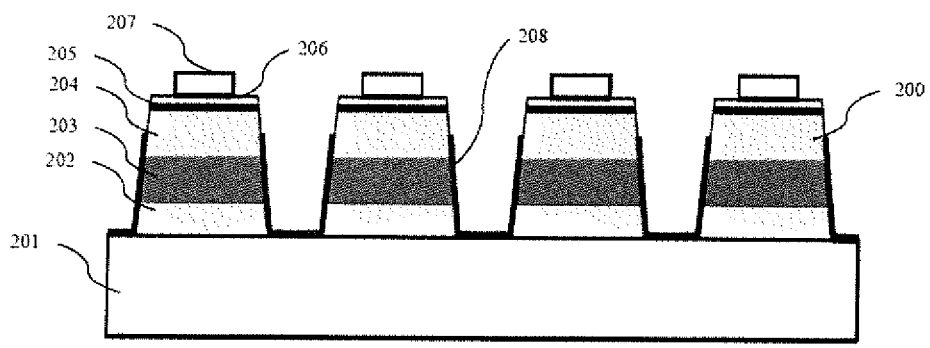

As shown in FIG. 6, the exposed second electrode 208 is etched and is removed. The remaining photoresist 209 is also removed. The N electrodes is in Ohmic contact with the N++ heavily doped region 203.

The micro-LEDs 200 with P and N electrodes on the growth substrate 201 can be tested at wafer level to check the electrical and/or optical characteristics thereof.

Figure 7:
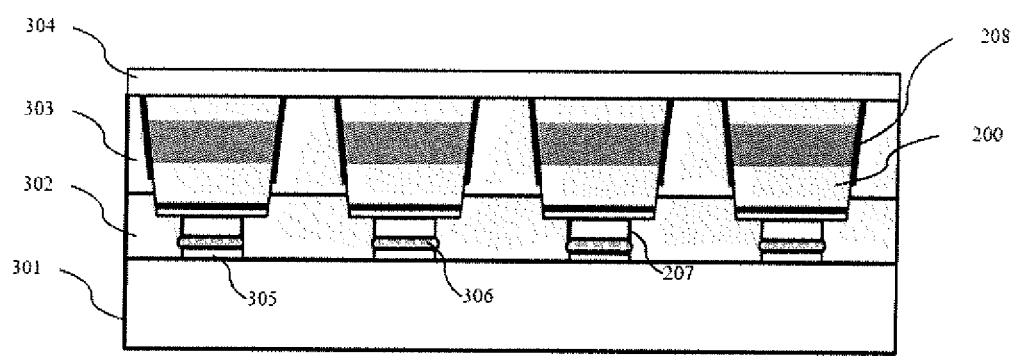

As shown in FIG. 7, the micro-LEDs 200 are transferred to a display substrate 301. For example, only KGD micro-LEDs 200 are transferred. The micro-LEDs 200 are bonded on the display substrate 301 via an anode 305, a bonding layer 306 and the P electrode 207. A dielectric layer 302 may be formed on the display substrate 301 and its upper surface is above the MQW region of the micro-LEDs 200. A conductive layer 303 is formed above the dielectric layer 302. It will connect the second electrode 208 to form a common electrode (common cathode). A protection layer 304 may be formed on top of the micro-LEDs to finish the display device.

In another embodiment, the present invention further includes a display device such as a display screen device or display panel. The display device is manufactured by using the method for manufacturing a display device with vertical micro-LEDs according to any of the embodiments according to the present invention.

In another embodiment, the present invention further includes an electronic apparatus. The electronic apparatus contains a display device according to the present invention. For example, the electronic apparatus can be a mobile phone, a pad computer and so on.

Although some specific embodiments of the present invention have been demonstrated in detail with examples, it should be understood by a person skilled in the art that the above examples are only intended to be illustrative but not to limit the scope of the present invention.

What is claimed is:

1. A method for manufacturing a display device with vertical micro-LEDs, comprising:
    forming the vertical micro-LEDs on a growth substrate;
    forming a first electrode on a top surface of each of the vertical micro-LEDs;
    forming a second electrode on a side surface of each of the vertical micro-LEDs; and
    transferring the vertical micro-LEDs from the growth substrate to a display substrate of a display device
    wherein the forming the second electrode includes:
        depositing the second electrode on the top surface and the side surface of each of the vertical micro-LEDs;
        coating a photoresist on the second electrode;
        etching at least a portion of the photoresist to expose a multiple quantum well region therein and a first type doped region and cover the second electrode on the side surface of the vertical micro-LED;
        etching the exposed second electrode; and
        removing any remaining photoresist.

2. The method according to claim 1, wherein the first electrode is a P electrode and the second electrode is an N electrode.

3. The method according to claim 1, wherein each of the vertical micro-LEDs includes a second type doped region provided above the growth substrate, a multiple quantum well region provided above the second type doped region and a first type doped region provided above the multiple quantum well region, and the second electrode is formed on side surface of the second type doped region.

4. The method according to claim 3, wherein the first type doped region is a P doped region, the second type doped region is an N doped region and includes an N heavily doped region, and the second electrode is formed on side surface of the N doped region and is Ohmic contact with the N heavily doped region.

5. The method according to claim 1, further comprising:
    testing the vertical micro-LEDs on the growth substrate through the first electrode and second electrode to determine known good dies of the vertical micro-LEDs on the growth substrate,
    wherein the transferring the vertical micro-LEDs includes:

transferring known good dies of the vertical micro-LEDs from the growth substrate to the display substrate.

6. The method according to claim 1, wherein the out layer of the first electrode is Au.

7. The method according to claim 1, wherein the second electrode is a stack of metal layers including Cr, Al, ITO, Ni, Au, Ag, Ti and TiN.

8. A display device, which is manufactured by using the method for manufacturing a display device with vertical micro-LEDs according to claim 1.

9. An electronics apparatus, comprising a display device according to claim 8.

* * * * *